(12) United States Patent
Hu et al.

(10) Patent No.: US 6,551,756 B1
(45) Date of Patent: Apr. 22, 2003

(54) SOLVENT-DEVELOPABLE PRINTING FORMULATIONS WITH IMPROVED PROCESSING CHARACTERISTICS

(75) Inventors: Yuxin Hu, San Diego, CA (US); Nathan J. Jacobsen, Encinitas, CA (US)

(73) Assignee: Napp Systems, Inc., San Marcos, CA (US)

( * ) Notice: Subject to any disclaimer, the term of this patent is extended or adjusted under 35 U.S.C. 154(b) by 0 days.

(21) Appl. No.: 09/624,104

(22) Filed: Jul. 24, 2000

(51) Int. Cl.$^7$ .......................... G03C 1/735; G03C 1/73; G03F 7/028; G03F 7/032; G03F 7/038
(52) U.S. Cl. .................. 430/270.1; 430/286.1; 430/287.1; 430/281.1; 430/306; 430/905; 430/907; 430/910
(58) Field of Search .............. 430/270.1, 281.1, 430/287.1, 306, 286.1, 907, 910, 905

(56) References Cited

U.S. PATENT DOCUMENTS

| 4,272,608 A | * | 6/1981 | Proskow | 430/281.1 |
|---|---|---|---|---|
| 4,943,513 A | * | 7/1990 | Lipson et al. | 430/270.1 |
| 4,985,513 A | * | 1/1991 | Iwanaga et al. | 526/80 |
| 5,415,749 A | * | 5/1995 | Hamilton | 430/270.1 |
| 6,171,735 B1 | * | 1/2001 | Li et al. | 430/12 |

FOREIGN PATENT DOCUMENTS

EP 0 945 264 A1 * 9/1999

* cited by examiner

*Primary Examiner*—Janet Baxter
*Assistant Examiner*—Sin J. Lee
(74) *Attorney, Agent, or Firm*—Carmody & Torrance LLP

(57) ABSTRACT

The present invention relates to solvent-developable printing formulations useful for the manufacture of printing plates. In particular, the present invention provides formulations which exhibit markedly improved processing characteristics when deposited on a printing plate, such as reduced tack, increased image resolution, and/or improved mechanical properties, e.g., tensile strength, elongation. In accordance with another aspect of the invention, there are provided methods for the preparation of said formulations and methods for use thereof.

69 Claims, No Drawings

SOLVENT-DEVELOPABLE PRINTING FORMULATIONS WITH IMPROVED PROCESSING CHARACTERISTICS

FIELD OF THE INVENTION

The present invention relates to solvent-developable printing formulations useful for the manufacture of printing plates. In particular, the present invention provides formulations which exhibit markedly improved processing characteristics when deposited on a printing plate. In accordance with another aspect of the invention, there are provided methods for the preparation of said formulations and methods for use thereof.

BACKGROUND OF THE INVENTION

Flexographic printing is widely used in the production of newspapers and in the decorative printing of packaging media. In flexographic printing, a layer of a flexible printing medium is deposited onto a flexible substrate such as a thin sheet of steel, aluminum, or synthetic polymer, to form a printing plate. A relief pattern corresponding to the negative image to be printed is formed in the printing medium. The plate is then mounted on the printing press, and printing commences.

One type of printing medium is natural or synthetic rubber. This printing medium has excellent mechanical properties, but the preparation of a printing plate with a rubber printing medium is labor intensive and slow. A pattern plate and a matrix board are prepared, and rubber plates are then hot press molded. Molded rubber printing media are not practical for printing applications with short deadlines, such as newspapers. Due to the nature of the medium and imaging techniques described above, photosensitive printing plates have been developed to meet the demand for fast, inexpensive processing and long press runs.

The use of a photosensitive printing medium for the manufacture of flexographic printing plates is described in general terms as follows. The photosensitive printing material is coated onto the substrate to form the printing plate. The coated side is exposed with light through a photographic negative of the image to be printed, causing photopolymerization of the exposed portion of the printing medium, which then becomes physically hardened and resistant to solvent removal. The unexposed and therefore unhardened portion of the printing medium is removed by washing with solvent, leaving a relief pattern of the image to be printed. The printing plate is mounted on a press and printing commences.

Non-flexographic printing plates such as letterpress plates are also used for printing newspapers, shoppers, and books. Photosensitive resin compositions have been developed for use with non-flexographic printing applications for the same reasons disclosed above for flexographic applications. The use of photosensitive printing media for the manufacture of letterpress printing plates is essentially the same as described above for flexographic printing applications.

Photosensitive resin compositions employed for the preparation of conventional photosensitive resin plates are based on liquid unsaturated polyesters, polyvinyl alcohols, water soluble polyamides, cellulose acetate succinates, alcohol soluble polyamides, etc. Conventional photosensitive resin compositions currently play an adequate role in the manufacture of flexible printing plates. However, due to the rapid growth of the printing industry, there is an ever increasing demand for photosensitive resin formulations with improved processing characteristics. For example, the resin composition must maintain a good balance between mechanical properties such as tensile strength, elongation, and Young's modulus. Additionally, in order to increase manufacturing efficiency, the resin will desirably exhibit reduced tack for ease of handling before photopolymerization and will also desirably photopolymerize as quickly as possible when exposed to the light source.

Accordingly, there remains a need in the art for photosensitive resin formulations having improved chemical and physical properties. The present invention fulfills this need and further provides related advantages.

SUMMARY OF THE INVENTION

In accordance with the present invention, there are provided solvent-developable printing formulations having one or more improved processing characteristics such as reduced tack, increased image resolution, and/or improved mechanical properties, e.g., tensile strength, elongation. In addition, there are also provided methods for the preparation of said formulations and methods for use thereof.

A desirable characteristic of any printing medium is developability in water, rather than organic solvents. Water-developable formulations are desirable for reasons such as ease of handling, health of workers who are in contact therewith, safety, and avoidance of environmental pollution. Therefore, in accordance with a particular aspect of the invention there are provided water-developable formulations with improved processing characteristics comprising a photosensitive resin and a metal-containing additive. The formulation according to an alternate embodiment of the present invention is aqueous base and/or organic solvent developable.

Due to the improved processing characteristics provided by the formulations of the present invention, printing plates prepared employing invention formulations have excellent form stability, thereby enabling such plates to be handled without the need for excessive care. The increased image resolution provided by invention formulations leads to higher print quality. Once photopolymerized, printing plates of the invention have excellent physical properties, enabling their use in many very demanding commercial applications, e.g., commercial flexographic printing. Such applications require the photopolymerized resin to have excellent water resistance (so that exposure to water-based inks does not significantly alter resin properties), as well as high resilience (so that the physical contacting associated with the printing process does not significantly degrade resin properties). Photopolymerized formulations of the invention maintain a good balance between tensile strength, % elongation, and Young's modulus to 30%. Photopolymerization of invention formulations yields products with ink transfer characteristics considered acceptable by flexographic printing standards and demonstrates sufficient toughness for extended printing runs as required in such areas as telephone directory and comic section printing.

DETAILED DESCRIPTION OF THE INVENTION

In accordance with the present invention, there are provided solvent-developable printing formulations comprising a photosensitive resin composition and a metal-containing additive. The metal-containing additive imparts improved processing characteristics to the resin, such as reduced tack, increased image resolution, and improved mechanical properties, (e.g., tensile strength, elongation) resulting in a markedly improved printing formulation.

Metal-containing additives contemplated for use in the practice of the present invention are coordination complexes of the formula $M^{+n}(Q)_m$, wherein M is a metal, n and m are integers from 1 to 4, and Q is an anionic ligand. The anionic ligand, Q, has the following structure:

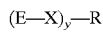

wherein:

E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, R is —H, optionally substituted $C_1$–$C_{20}$ alkyl or alkenyl, or optionally substituted aryl, and y is 1, 2, or 3.

Coordination complexes contemplated for use in the practice of the present invention include complexes of transition metals such as Mn, Re, Fe, Ru, Os, Co, Rh, Ir, Ni, Pd, Pt, and the like. Presently preferred transition metals contemplated for use herein include Mn, Fe, Co, and Ni. Particularly preferred transition metals are Mn and Fe.

Coordination complexes contemplated for use in the practice of the present invention also include main group metals such as Cu, Ag, Au, Zn, Al, Ca, Mg, and the like. Presently preferred main group metals contemplated for use herein include Al, Zn, and Cu. Coordination complexes contemplated for use in the practice of the present invention also include alkali metals and alkaline earth metals.

Coordination complexes contemplated for use in the practice of the present invention may contain a wide variety of ligands. In one embodiment the ligands contain oxygen. In a presently preferred embodiment, the anionic ligand is an acetylacetonate (acac). In another presently preferred embodiment, the anionic ligand is a carboxylate, such as acetate. In a particularly referred embodiment, the ligand is an acrylate. Other ligands contemplated for use in the practice of the present invention include sulfur-based ligands such as sulfonates.

A variety of photosensitive resin compositions are contemplated for use in the practice of the present invention. These resins are based on a wide variety of reactive materials, such as, for example, liquid unsaturated polyesters, polyvinyl alcohols, water soluble polyamides, polyurethanes, cellulose acetate succinates, alcohol soluble polyamides, water-developable acrylic polymers, polyalkadienes (for example, polybutadiene, optionally with comonomers such as styrene, (meth)acrylates, and the like), and the like. With such materials, the photopolymerizable resin is exposed to crosslinking conditions, then the uncured resin is removed from said support by washing with a suitable solvent.

A presently preferred photosensitive resin composition comprises a photosensitive copolymer, a basic nitrogen-containing compound, an unsaturated monomer, and optionally a photopolymerization initiator. Copolymers contemplated for use in the practice of the present invention are prepared from a combination of several components, e.g., an aliphatic conjugated diene monomer, an α,β-ethylenically unsaturated carboxylic acid, a polyfunctional vinyl monomer, and optionally a monofunctional vinyl monomer. Typically, such compositions comprise in the range of about:

(i) 5 up to 95 mol % of an aliphatic conjugated diene monomer, (ii) 1 up to 30 mol % of an α,β-ethylenically unsaturated carboxylic acid, (iii) 0.1 up to 10 mol % of a polyfunctional vinyl monomer, and (iv) 0 up to 70 mol % of a monofunctional vinyl monomer. Preferred copolymer compositions employed in the practice of the present invention comprise in the range of:

(i) 40 up to 85 mol % of an aliphatic conjugated diene monomer, (ii) 2.5 up to 15 mol % of an α,β-ethylenically unsaturated carboxylic acid, (iii) 0.5 up to 5 mol % of a polyfunctional vinyl monomer, and (iv) 5 up to 30 mol % of a monofunctional vinyl monomer.

Aliphatic conjugated diene monomers contemplated for use in the practice of the present invention include butadiene, isoprene, chloroprene, dimethylbutadiene, and the like.

α,β-ethylenically unsaturated carboxylic acids contemplated for use in the practice of the present invention include methacrylic acid, acrylic acid, itaconic acid, maleic acid, and the like.

Polyfunctional vinyl monomers contemplated for use in the practice of the present invention include ethyleneglycol dimethacrylate, divinyl benzene, 1,6-hexanediol diacrylate, 1,4-butanediol diacrylate, and the like.

Monofunctional vinyl monomers contemplated for use in the practice of the present invention include ethyl (meth) acrylate, methyl acrylate, isopropyl (meth)acrylate, lauryl (meth)acrylate, hydroxyethyl methacrylate, methyl methacrylate, β-carboxyethyl acrylate, and the like, as well as mixtures of any two or more thereof.

Basic nitrogen-containing compounds contemplated for use in the practice of the present invention include dimethylaminopropyl methacrylamide (DMAPMA), N,N-dialkylaminoalkyl (meth)acrylamide, alkylamino (meth) acrylamide, N-vinyl pyrrolidone, N-vinylcaprolactone, tertiary amines (for example, N,N-dimethyl-4-morpholinethane amine), and the like.

Ethylenically unsaturated monomers having an acrylate core structure contemplated for use in the practice of the present invention include 1,4-butanediol dimethacrylate, lauryl methacrylate, polyethylene glycol (400) dimethacrylate, highly ethoxylated trimethylol propane triacrylate, propoxylated neopentyl glycol diacrylate, ethyoxylated neopentylglycol di(meth)acrylate, polyethylene glycol (600) di(meth)acrylate, isobornyl acrylate, 1,6-hexanediol di(meth)acrylate, ethoxylated bisphenol A di(meth)acrylate, cyclohexyl(meth)acrylate, diethylene glycol di(meth)acrylate, glycerol di(meth)acrylate, aliphatic urethane di(meth)acrylate, and the like. Presently preferred ethylenically unsaturated monomers contemplated for use in the practice of the present invention include 1,4-butanediol dimethacrylate, lauryl methacrylate, polyethylene glycol (400) dimethacrylate, highly ethoxylated trimethylol propane triacrylate, aliphatic urethane diacrylate, and the like.

Those of skill in the art recognize that a wide range of photopolymerization initiators can be used in the practice of the present invention. The initiator used in the composition of the invention includes ordinary photoreaction initiators such as α-diketone compounds (e.g., diacetyl, benzil, and the like), acyloins (e.g., benzoin, pivaloin, and the like), acyloin ethers (e.g., benzoin methyl ether, benzoin ethyl ether, benzoin propyl ether, and the like), polynuclear quinones (anthraquinone, 1,4-naphthoquinone), acyl phosphine oxides, and the like. The initiator is typically added in an amount of 0.01 to 10 parts by weight, preferably 0.5 to 5 parts by weight, per 100 parts by weight of the copolymer. Presently preferred initiators include benzyl dimethyl ketal, 2-ethyl anthraquinone, or mixtures thereof.

Polybutadienes contemplated for use in the practice of the present invention include 1,2-polybutadiene (cis-, trans-, or mixtures thereof), 1,4-polybutadiene (cis-, trans-, or mixtures thereof), maleic anhydride adducts of polybutadiene, which may then be modified via standard ring-opening techniques and subsequent (half) esterification or (half) amidation, and the like. Presently preferred polybutadiene used in the practice of the present invention is cis-1,2-polybutadiene.

Invention compositions may also contain a plasticizer, which acts to reduce the glass transition temperature of the polymer, thereby easing processability of the composition. Examples of plasticizers useful in the practice of the present invention include glycerin, ethoxylated phenols, ethoxylated alkylated phenols, ethoxylated glycerin, and the like.

Presently preferred formulations contemplated for use in the practice of the present invention comprise about 30 to 90 wt % of the copolymer, about 0.2 to 2 moles of the basic nitrogen-containing compound per mole of carboxyl groups in the copolymer, about 5 to 70 wt % of the unsaturated monomer, about 0.01 to 10 wt % of the photopolymerization initiator, and about 0.01 to 20 wt % of the metal-containing additive.

In a preferred embodiment, the formulation comprises about 0.05 to 10 wt % of the metal containing additive. In a particularly preferred embodiment, the formulation comprises about 0.1 to 2 wt % of the metal-containing additive.

Invention formulations are prepared by using conventional mixing and milling techniques well known in the art. For example, the formulation components can be compounded using a mixer, kneader, or extruder. The components may be combined at the start of the compounding process, or alternatively, one or more of the liquid components may be preabsorbed into any of the solid components before compounding. The resulting compositions can be formed into a photosensitive medium element by forming into a sheet by molding, calendaring, rolling, extruding, or a similar process.

In accordance with another aspect of the invention, there are provided printing plates comprising a suitable substrate and a layer of photosensitive resin composition deposited thereupon. To form a printing plate, the photosensitive resin composition is laminated onto a suitable solid substrate. Selected portions of the resin compositions are exposed to actinic radiation, crosslinking said resin. The unexposed portions of the resin composition are washed away in a suitable solvent, leaving behind the desired image on the printing plate.

A variety of substrates may be used with the photosensitive compositions. The term "substrate" means any solid layer giving support and stability to the photosensitive resin. Presently preferred substrates contemplated for use in the practice of the present invention include natural or synthetic materials that can be made into a rigid or flexible sheet form. These materials include steel, copper, or aluminum sheets, plates, or foils; paper; or films or sheets made from synthetic polymeric materials such as polyesters, polystyrene, polyolefins, polyamides, and the like.

The photosensitive resin composition may be deposited onto the substrate in a variety of ways, e.g., by extrusion, roll coating, heat processing, solvent casting, and the like. These techniques can be readily carried out by those skilled in the art.

The desired image is produced on the printing plate by exposing selected portions of the resin to actinic radiation. Selective exposure of the photosensitive resin can be achieved for example, by the use of an image-bearing transparency such as a negative film on the surface of the photosensitive layer, through the front side of the photosensitive resin. Areas of the transparency opaque to actinic radiation prevent the initiation of free-radical polymerization within the photosensitive layer directly beneath the transparency. Transparent areas of the image-bearing element will allow the penetration of actinic radiation into the photosensitive layer, initiating free-radical polymerization, rendering those areas insoluble in the processing solvent. Alternatively, exposure of selected portions of the photosensitive layer to laser radiation may also initiate free-radical polymerization, rendering those areas insoluble in the processing solvent. The unexposed portions of the resin are selectively removed by washing in a suitable solvent. Washing may be accomplished by a variety of processes, including brushing, spraying, or immersion. The resulting surface has a relief pattern that reproduces the image to be printed.

The invention will now be described in detail by reference to the following non-limiting examples.

EXAMPLES

The effect of adding a variety of compounds to a photosensitive resin composition was evaluated. Compounds tested are abbreviated as follows:

| Abbreviation | Compound |
|---|---|
| $Zn(acrylate)_2$ | Zinc diacrylate |
| $Ca(acrylate)_2$ | Calcium diacrylate |
| $Mg(acac)_2$ | Magnesium acetylacetonate |
| $Zn(acetate)_2$ | Zinc acetate |
| $Al(acac)_3$ | Aluminum acetylacetonate |
| $Zn(acac)_2$ | Zinc acetylacetonate |
| $Co(acetate)_2$ | Cobalt(II) acetate |
| $Ni(acac)_2$ | Nickel(II) acetylacetonate |
| $Mn(acac)_2$ | Manganese(II) acetylacetonate |
| $Fe(acac)_3$ | Ferric acetylacetonate |
| $Cu(acac)_2$ | Cupric acetylacetonate |

Each of the above compounds was mixed into a standard photopolymerizable resin, at levels ranging from 0.1 wt % to 1.2 wt %.

Example 1

Preparation of Resin with 0.4 % $Zn(acrylate)_2$

The liquid portion of the resin was mixed at room temperature. Components were added in the following order:

| | |
|---|---|
| N,N-dimethyl-4-morpholinethane amine | 16 parts |
| Lauryl acrylate | 16.8 parts |
| Polyethylene glycol 400 diacrylate | 16.5 parts |
| Ethoxylated trimethylolpropane triacrylate | 20.6 parts |
| Ethoxylated nonyl phenol | 27.5 parts |

The solution was mixed until homogeneous. The following solid components of the mixture were then added:

| | |
|---|---|
| Butylated hydroxy toluene | 1.4 parts |
| 1-hydroxycyclohexyl phenyl ketone | 7.2 parts |
| 2,4,6-trimethylbenzoyldiphenylphosphine oxide | 1.4 parts |
| $Zn(acrylate)_2$ | 1.1 parts |

A polymer blend comprising synthetic rubber from Japan Synthetic Rubber (JSR) (TA906) (146 parts) and Kraton D1107 from Shell Chemical (20.6 parts) was pressed at 200 tons and 80° C. for five minutes, followed by conditioning on a two roll mill at 70° C. for five minutes. To this hot polymer blend was added the liquid portion of the resin (with dissolved solids) at a controlled rate until all of the solution was added. The resulting resin was protected from light and oxygen exposure until needed for testing. Before testing, the resin was molded onto a suitable substrate at the required thickness.

The resulting resin was subjected to a variety of tests, as described in Examples 2–5.

Example 2

Measurement of Surface Tack

Surface tack of the resins was measured quantitatively by use of the Heidon Dynamic Strain Amplifier. The Heidon amplifier uses a steel roller, sample platform and a device which measures the voltage required to maintain rolling as the sample platform moves away from it. Mass is placed on top of the roller to apply additional force to the resin surface. Voltage required to maintain rolling is recorded (the maximum reading possible is 5 volts). Resins which exhibit greater surface friction or "tack" give higher output readings.

Plates are made to standard resin relief thickness. The plates are protected from air until fifteen minutes prior to measurement. Measurements are obtained as follows: a plate is loaded onto a sample tray and securely clamped; a roller is lowered onto the resin surface and a mass (1 kg) is placed on top of the roller; the roller is allowed to rest on the resin surface prior to measurement to ensure good contact between roller and resin surface. Voltage output is measured continually for twenty seconds as the tray is pulled away from the roller. Results are summarized in Table 1.

TABLE 1

Measurement of Surface Tack

| Resin | Heidon Tack |
| --- | --- |
| CONTROL | >5 V |
| Zn(acrylate)$_2$ 0.8 wt % | 1.2 |
| Zn(acetate)$_2$ 0.8% | 1.4 |
| Zn(acrylate)$_2$ 0.4% | 1.6 |
| Fe(acac)$_3$ 0.36% | 1.7 |
| Zn(acac)$_2$ 0.5% | 1.7 |
| Cu(acac)$_2$ 0.36% | 1.8 |
| CO(acac)$_2$ 0.4% | 1.9 |
| Ni(acac)$_2$ 0.4% | 1.9 |
| Mn(acac)$_2$ 0.73% | 2.0 |
| Al(acac)$_3$ 0.59% | 2.1 |
| Fe(acac)$_3$ 0.25% | 2.3 |
| Fe(acac)$_3$ 0.1% | 2.3 |
| Cu(acac)$_3$ 0.16% | 2.7 |
| Mn(acac)$_2$ 0.43% | 3.3 |
| Ca(acrylate)$_2$ 0.8% | >5 V |
| Mg(acac)$_2$ 0.8% | >5 V |

As shown in Table 1, with the exception of Mg and Ca, all of the metal compounds improved the surface tack of the resin relative to the control.

Example 3

Measurement of Image Resolution

Image resolution tests were performed to determine the effect of the metal-containing additives on resolution of the polymerized image. Accordingly, plates were made to a standard resin relief thickness. A standard test negative is used to evaluate image resolution as plates are exposed in a Consulox (medium mercury pressure) exposure unit.

The bump and main times shown in Table 2 are the optimum exposures that a plate receives to achieve the best overall image quality. The bump is a low intensity pre-exposure which sensitizes the resin before the plate is subjected to the high intensity main exposure. Lower bump and main times indicate a more photosensitive resin.

Minimum dot % is the minimum size highlight dot which the imaged resin can hold and print. Highlight dot holding is a critical measurement of a resin's performance. Print quality improves with finer features (i.e., lower % highlight dots).

Dot shape is a measurement of the diameter of the dot, shoulder angle, and levelness of the dot top. Dots which are uniform in shape, with strong bases and level tops result in good print quality. Dot shape quality is reported in terms of excellent to poor, wherein excellent dot shape indicates a dot which is fully relieved, containing a level, circular top, and shoulders evenly sloping to a wide base.

The depth of the reverse images on the exposed plate are qualitatively evaluated. Excellent reverse depth indicates a resin which has deep reverse areas with little "fill in" from surrounding resin. Reverse depth is important in producing a print with clean, sharp detail and lettering.

Reverse quality provides a measurement of the cleanliness of the edges of the reverse image. A resin with excellent reverse quality will have sharp, clearly defined letters and shadow areas, while areas between highlight dots will be clear. Results are summarized in Table 2.

TABLE 2

Measurement of Polymerization Rate and Image Resolution*

| Resin | Minimum Dot % | Dot Shape | Reverse Depth | Reverse Quality | Bump I.U. | Main I.U. |
| --- | --- | --- | --- | --- | --- | --- |
| Control | 3-4 | G | P | F | 4.5 | 42 |
| 0.4% Zn(acrylate)$_2$ | 4 | G | F | F | 4.8 | 40–45 |
| 0.8% Zn(acetate)$_2$ | 4 | G | P | P | 4.5 | 45 |
| 0.51%Zn(acac)$_2$ | 4 | G-E | P-F | F-G | 4.4 | 50 |
| 0.43%Mn(acac)$_2$ | 2-1 | G-E | G | G | 4.4–5.0 | 50–60 |
| 0.73%Mn(acac)$_2$ | 4 | F | P | P | 4.8 | 60 |
| 0.25% Fe(acac)$_3$ | 4 | E | E | E | 5.8 | 65–70 |
| 0.36%Fe(acac)$_3$ | 5 | E | E | E | 5.8 | 80–90 |
| 0.1%Fe(acac)$_3$ | 4 | G-E | G | G | 4.4 | 55 |
| 0.16%Cu(acac)$_2$ | 3 | G | P | P-F | 4.4 | 60 |
| 0.36%Cu(acac)$_2$. | 2 | G | P | P | 5.2 | 60–65 |
| 0.8%Mg(acac)$_2$ | 3 | F | F | F | 4.4 | 45 |
| 0.4%Co(acac)$_2$ | 3 | G | F | F | 4.2 | 55 |
| 0.4%Ni(acac)$_2$ | 3 | G | P | P | 4.2 | 55 |

*E = excellent G = good F = fair P = poor
I.U. = integrated units (integrated units take bulb aging and corresponding changes in intensity into consideration)

As shown in Table 2 by the bump and main exposure times, there is no significant improvement in polymerization speed/resin sensitivity with addition of a metallic compound. However, the compounds containing Mn and Fe significantly improve image resolution. These resins show improved dot shape, reverse depth, and reverse quality. The resin containing Mn holds a finer dot relative to the control.

Example 4

Measurement of Physical Properties of Exposed Resins

The physical properties of exposed resins were measured as follows. Slabs of cured resin were prepared by repeatedly heat pressing the photopolymer resin into 0.067 inch thick frames between two sheets of polyester film until a bubble-free slab is obtained. It was then cured by exposure to a 5 kilowatt medium pressure mercury lamp at a distance of 36 inches for five minutes on each side.

A. Resilience Test Method

The cured resin was cut into four equal pieces (2.5 cm×2.5 cm), then stacked. The final stack height should be 12 mm±0.5 mm. The stack is then placed under a resilometer (Shore SR1 Resilometer, Shore Instrument and Manufacturing Co., Jamaica, N.Y.) and the plunger dropped six times. The average bounce height of the last three drops is reported. A smooth release of the plunger produces the most reproducible results.

B. Hardness Test Method 150 grams of raw resin are placed between two sheets of silicone-coated mylar and the resulting sandwich is positioned in the center of a molding press. 150 tons of force are applied @ 70° C. for 5 seconds. Six to eight 4 inch×4 inch squares of the resulting pressed, raw resin are cut out and stacked. The weight of the stack should be 75 to 80 grams.

The resin stack is placed in the center of a square steel frame mold with internal dimensions of 6 inch×6 inch×3 mm thick. The resin stack and steel frame are placed between 2 sheets of silicone-coated mylar and the resulting assemblage positioned in the center of the molding press. 100 tons of force are applied @ 70° C. for 20 seconds. The above-described procedure is repeated until there is enough bubble-free resin to cut out two 5 cm×5 cm squares.

The molded resin is exposed for 5 minutes to a medium pressure mercury vapor lamp, and mounted in a Newsprinter II exposure unit (NAPP SYSTEMS INC., San Marcos, Calif.) while still in the mold. The square is turned over and the other side exposed for an additional 5 minutes.

Approximately ½ inch of cured resin is trimmed from each side of the 6 inch×6 inch square. Two 5 cm×5 cm squares are cut out and stacked with a thickness tolerance of ±50 microns. The resin stack is placed in a constant temperature room at a temperature of 25° C. for 2 hours before making any measurements.

The Shore automatic operating stand is adjusted so that the bottom plate of the durometer (not the indenter) is approximately ¼ inch from the specimen. This procedure is used for calibrating the durometer with standards and for making specimen measurements. The automatic operating stand is then turned on and five measurements are made, ½ inch from the edge at each corner and in the center. The stack is turned over and five more measurements are made.

The average and standard deviation of the ten measurements is then reported.

C. Tensile Strength and Elongation Test Methods

For sample testing, a 100 Kg (1KN) load cell on an Instron Strain Gauge Extensometer Model 4202 (Instron Corporation, Canton, Mass.) is used. Instrument parameters employed include:

| | |
|---|---|
| Sample width | 10 mm, |
| Gauge length | 50 mm, |
| Grip distance | 70 mm, and |
| Cross head speed | 75 mm/min |

A dumbbell sample (~1.7 mm thick, fully cured resin) is inserted between clamps (positioned about 70 mm apart) and tightened well. It is desirable for the sample to be as straight as possible, with as little slack as possible.

Enter the mean thickness for the sample, and start the instrument. Repeat for each sample (about 8–10 samples should be tested to obtain good statistical results). The instrument's computer will calculate mean values for tensile strength and % elongation.

TABLE 3

Physical Properties of Exposed Resins

| Resin | Shore A Durometer | Resilience | Tensile g/mm$^2$ | Elongation at max load % | Toughness Kg/mm$^2$ | B.O.E. Kg/mm | Observations |
|---|---|---|---|---|---|---|---|
| Control | 66 | 58 | 350 | 97 | 0.16 | 1.2 | Sticky resin |
| 0.4% Zn(acrylate)$_2$ | 71–72 | 60 | 366 | 102 | 0.17 | 1.0 | Resin starting to crack |
| 0.8% Zn acetate | 70 | 62 | 391 | 126 | 0.19 | 1.6 | Dry resin |
| 0.51% Zn(acac)$_2$ | 67–69 | 60 | 374 | 118 | 0.21 | 1.2 | Moderately dry resin |
| 0.73% Mn(acac)$_2$ | 68–69 | 60 | 373 | 117 | 0.21 | 1.5 | Resin cracks Light brown |
| 0.25% Fe(acac)$_3$ | 69–70 | 60 | 370 | 122 | 0.21 | 1.1 | Light pink |
| 0.36% Fe(acac)$_3$ | 65 | 63 | 388 | 115 | 0.21 | 1.4 | Light pink, very dry resin |
| 0.16% Cu(acac)$_2$ | 68–69 | 59 | 286 | 106 | 0.15 | 0.91 | Light blue |
| 0.36% Cu(acac)$_2$ | 67 | 62 | 315 | 106 | 0.17 | 1.2 | Light blue, very dry |
| 0.43% Mn(acac)$_2$ | — | — | 376 | 124 | 0.22 | 1.7 | |

TABLE 3-continued

Physical Properties of Exposed Resins

| Resin | Shore A Durometer | Resilience | Tensile g/mm² | Elongation at max load % | Toughness Kg/mm² | B.O.E. Kg/mm | Observations |
|---|---|---|---|---|---|---|---|
| 0.4% Co(acac)₂ | — | — | 358 | 120 | 0.21 | 1.6 | Light violet |
| 0.4% Ni(acac)₂ | — | — | 347 | 118 | 0.20 | 1.6 | Very dry resin Light blue |

As shown in Table 3, the physical properties of polymerized resins are not negatively impacted by addition of each metal containing additive. Particularly, durometer and resilience measurements are not significantly affected. Durometer and resilience are important measurements which indicate how well ink will be transferred from image to paper.

Example 5

Measurement of Physical Properties of Unexposed Resins

General procedures for the measurement of physical properties is set forth in Example 4. Results of similar tests with unexposed resins are summarized in Table 4.

TABLE 4

Physical Properties of Unexposed Resins

| Resin | Tensile g/mm² | Elongation % at max load | Toughness Kg-mm² |
|---|---|---|---|
| Control | 5.6 | 24 | 0.005 |
| Zn(acrylate)₂ 0.4% | 10.2 | 26 | 0.065 |
| Al(acac)₃ 0.59% | 15.1 | 45 | 0.005 |
| Mn(acac)₂ 0.4% | 9.8 | 34 | 0.007 |
| Zn acetate 0.8% | 9.6 | 35 | 0.007 |
| Co acetate 0.4% | 14.0 | 45 | 0.007 |
| Mg(acac)₂ 0.8% | 4.6 | 18 | 0.003 |
| Ni(acac)₂ 0.4% | 9.6 | 36 | 0.006 |
| Fe(acac)₃ 0.25% | 10.5 | 93 | 0.01 |

As shown in Table 4, the physical properties of unexposed resins are improved by the addition of Fe, Co, Mn, Zn, Al or Ni containing additives. All show improved elongation and tensile strength over unexposed standard resins. The improved elongation and tensile strength may be of benefit in resin/plate processing while the improved strength of the uncured resin may lead to improved image quality as the resin may better withstand handling and processing conditions.

While the invention has been described in detail with reference to certain preferred embodiments thereof, it will be understood that modifications and variations are within the spirit and scope of that which is described and claimed.

What is claimed is:

1. A formulation comprising a solvent-developable photosensitive resin and an amount of a metal-containing additive effective to enhance the properties of said resin, wherein the metal-containing additive is a coordination complex of the formula $M^+(Q)$, wherein M is an alkali metal, Ag, or Au, and Q is an anionic ligand having the structure:

wherein:
E is $NR_a$, $PR_a$, O, or S, wherein $R_a$ is —H, optionally substituted $C_1$ to $C_{20}$ alkyl, or optionally substituted aryl,
X is optional and if present, is carbonyl, thiocarbonyl, $SO_2$, or imine, and R is —H, optionally substituted $C_1$–$C_{20}$ alkyl or alkenyl, or optionally substituted aryl.

2. The formulation according to claim 1, wherein the enhanced property is the reduction of tack.

3. The formulation according to claim 1, wherein the enhanced property is increased image resolution.

4. The formulation according to claim 1, wherein the enhanced property is increased tensile strength.

5. The formulation according to claim 1, wherein the enhanced property is increased elongation.

6. The formulation according to claim 1, wherein the anionic ligand is a carboxylate.

7. The formulation according to claim 6, wherein the carboxylate is an acrylate.

8. The formulation according to claim 6, wherein the carboxylate is an acetate.

9. The formulation according to claim 1, wherein the formulation is water-developable.

10. The formulation according to claim 9, wherein the formulation is developable in aqueous base.

11. The formulation according to claim 1, wherein the formulation is developable in organic solvents.

12. The formulation according to claim 1, wherein said resin comprises a photosensitive copolymer, a basic nitrogen-containing compound, an unsaturated monomer, and optionally a photopolymerization initiator, wherein the copolymer comprises an aliphatic conjugated diene monomer, an α,β-unsaturated carboxylic acid, a polyfunctional vinyl monomer, and a monofunctional vinyl monomer.

13. The formulation according to claim 12, wherein the diene monomer is butadiene, isoprene, or chloroprene; the α,β-unsaturated carboxylic acid is acrylic acid or methacrylic acid; the polyfunctional vinyl monomer is ethylene glycol dimethacrylate, divinyl benzene, or 1,6-hexanediol diacrylate; and the monofunctional vinyl monomer is methyl acrylate or ethyl acrylate.

14. The formulation according to claim 12 comprising about 30 to 90 wt % of the copolymer, about 0.2 to 2 moles of the basic nitrogen-containing compound per mole of carboxyl groups in the copolymer, about 5 to 70 wt % of the unsaturated monomer, about 0.01 to 10 wt % of the photopolymerization initiator, and about 0.01 to 20 wt % of the metal-containing additive.

15. The formulation according to claim 14, wherein the metal-containing additive is a tack-reducing agent.

16. The formulation according to claim 14, wherein the metal-containing additive is an image resolution-enhancing agent.

17. The formulation according to claim 14, wherein the metal-containing additive is a mechanical property-enhancing agent.

18. A method for enhancing the properties of a solvent-developable photosensitive resin, said method comprising combining an effective amount of a coordination complex with the resin, wherein the coordination complex has the formula $M^+(Q)$, wherein M is an alkali metal, and Q is an anionic ligand having the structure:

$$(E-X)-R$$

wherein:
E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

19. The method according to claim 18, wherein the enhanced property is reduction of tack.

20. The method according to claim 18, wherein the enhanced property is increased image resolution.

21. The method according to claim 18, wherein the enhanced property is increased tensile strength.

22. The method according to claim 18, wherein the enhanced property is increased elongation.

23. A method for improving the release of a substrate on which an image is being imparted from the printing surface containing said image, said method comprising combining an effective amount of a coordination complex with a resin, wherein the coordination complex has the formula $M^+(Q)$, wherein M is an alkali metal, and Q is an anionic ligand having the structure:

$$(E-X)-R$$

wherein:
E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

24. A method for improving the processing characteristics of a solvent-developable photosensitive resin, said method comprising combining an effective amount of a coordination complex with the resin, wherein the coordination complex has the formula $M^+(Q)$, wherein M is an alkali metal, and Q is an anionic ligand having the structure:

$$(E-X)-R$$

wherein:
E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

25. A stackable printing plate, wherein a plurality of said plates can be stacked without the need for release paper therebetween, said plates comprising an imaging formulation comprising a water-developable photosensitive resin and an effective amount of a tack-reducing agent, said tack reducing agent having the formula $M^+(Q)$, wherein M is an alkali metal, and Q is an anionic ligand.

26. A formulation comprising a solvent-developable photosensitive resin and a metal-containing additive, wherein said resin comprises a photosensitive copolymer, a basic nitrogen-containing compound, an unsaturated monomer, and optionally a photopolymerization initiator, wherein the photosensitive copolymer comprises an aliphatic conjugated diene monomer, an α,β-unsaturated carboxylic acid, a polyfunctional vinyl monomer, and a monofunctional vinyl monomer, and wherein said metal-containing additive is a coordination complex of the formula $M^{+n}(Q)_m$, wherein:

M is a metal selected from the group consisting of alkali metals, Ag, Au, Re, Ru, Rh, Ir, Pd, and Pt;

n and m are integers from 1 to 4; and

Q is an anionic ligand having the structure:

$$(E-X)_y-R$$

wherein:
E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl, and y is 1, 2, or 3.

27. The formulation according to claim 26, wherein the anionic ligand is an acetylacetonate.

28. The formulation according to claim 26, wherein the anionic ligand is a carboxylate.

29. The formulation according to claim 28, wherein the carboxylate is an acrylate.

30. The formulation according to claim 28, wherein the carboxylate is an acetate.

31. A method for enhancing the properties of a solvent-developable photosensitive resin, said method comprising combining an effective amount of a coordination complex with the resin, wherein said resin comprises a photosensitive copolymer, a basic nitrogen-containing compound, an unsaturated monomer, and optionally a photopolymerization initiator, wherein the copolymer comprises an aliphatic conjugated diene monomer, an α,β-unsaturated carboxylic acid, a polyfunctional vinyl monomer, and a monofunctional vinyl monomer, and wherein said metal-containing additive is a coordination complex of the formula $M^{+n}(Q)_m$, wherein:

M is a metal selected from the group consisting of alkali metals, Ag, Au, Re, Ru, Rh, Ir, Pd, and Pt;

n and m are integers from 1 to 4; and

Q is an anionic ligand having the structure:

$$(E-X)-R$$

wherein:
E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

32. A method for improving the release of a substrate on which an image is being imparted from the printing surface containing said image, said method comprising combining an effective amount of a coordination complex with a resin, wherein the coordination complex has the formula $M^{+n}(Q)_m$, wherein:

M is a metal selected from the group consisting of alkali metals, Ag, Au, Re, Ru, Rh, Ir, Pd, and Pt;

n and m are integers from 1 to 4; and

Q is an anionic ligand having the structure:

(E—X)—R wherein:

E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl, and wherein the resin comprises a photosensitive copolymer, a basic nitrogen-containing compound, an unsaturated monomer, and optionally a photopolymerization initiator, wherein the copolymer comprises an aliphatic conjugated diene monomer, an α,β-unsaturated carboxylic acid, a polyfunctional vinyl monomer, and a monofunctional vinyl monomer.

33. A method for improving the processing characteristics of a solvent-developable photosensitive resin, said method comprising combining an effective amount of a coordination complex with the resin, wherein the coordination complex has the formula $M^{+n}(Q)_m$, wherein:

M is a metal selected from the group consisting of alkali metals, Ag, Au, Re, Ru, Rh, Ir, Pd, and Pt;

n and m are integers from 1 to 4; and

Q is an anionic ligand having the structure:

(E—X)—R wherein:

E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl, and wherein the resin comprises a photosensitive copolymer, a basic nitrogen-containing compound, an unsaturated monomer, and optionally a photopolymerization initiator, wherein the copolymer comprises an aliphatic conjugated diene monomer, an α,β-unsaturated carboxylic acid, a polyfunctional vinyl monomer, and a monofunctional vinyl monomer.

34. A formulation comprising a water-developable photosensitive resin and an amount of a metal-containing additive effective to enhance the properties of said resin, wherein the metal-containing additive is a coordination complex of the formula $M^+(Q)$, wherein M is an alkali metal, Ag, or Au, and Q is an anionic ligand.

35. The formulation according to claim 34, wherein the anionic ligand, Q, has the structure:

(E—X)—R wherein:

E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

36. The formulation according to claim 35, wherein the anionic ligand is a carboxylate.

37. The formulation according to claim 36, wherein the carboxylate is an acrylate.

38. The formulation according to claim 36, wherein the carboxylate is an acetate.

39. The formulation according to claim 34, wherein the enhanced property is the reduction of tack.

40. The formulation according to claim 34, wherein the enhanced property is increased image resolution.

41. The formulation according to claim 34, wherein the enhanced property is increased tensile strength.

42. The formulation according to claim 34, wherein the enhanced property is increased elongation.

43. The formulation according to claim 34, wherein the formulation is developable in an aqueous base.

44. The formulation according to claim 34, wherein said resin comprises a photosensitive copolymer, a basic nitrogen-containing compound, an unsaturated monomer, and optionally a photopolymerization initiator, wherein the copolymer comprises an aliphatic conjugated diene monomer, an α,β-unsaturated carboxylic acid, a polyfunctional vinyl monomer, and a monofunctional vinyl monomer.

45. The formulation according to claim 44 comprising about 30 to 90 wt % of the copolymer, about 0.2 to 2 moles of the basic nitrogen-containing compound per mole of carboxyl groups in the copolymer, about 5 to 70 wt % of the unsaturated monomer, about 0.01 to 10 wt % of the photopolymerization initiator, and about 0.01 to 20 wt % of the metal-containing additive.

46. The formulation according to claim 45, wherein the metal-containing additive is a tack-reducing agent.

47. The formulation according to claim 45, wherein the metal-containing additive is an image resolution-enhancing agent.

48. The formulation according to claim 45, wherein the metal-containing additive is a mechanical property-enhancing agent.

49. A method for enhancing the properties of a water-developable photosensitive resin, said method comprising combining an effective amount of a coordination complex with the resin, wherein the coordination complex has the formula $M^+(Q)$, wherein M is an alkali metal and Q is an anionic ligand.

50. The method according to claim 49, wherein the anionic ligand, Q has the structure:

(E—X)—R wherein:

E is $NR_a$, $PR_a$, O, or S, wherein $R_a$ is —H, optionally substituted $C_1$ to $C_{20}$ alkyl, or optionally substituted aryl, X is optional and if present, is carbonyl, thiocarbonyl, $SO_2$, or imine, and R is —H, optionally substituted $C_1$–$C_{20}$ alkyl or alkenyl, or optionally substituted aryl.

51. The method according to claim 49, wherein the enhanced property is reduction of tack.

52. The method according to claim 49, wherein the enhanced property is increased image resolution.

53. The method according to claim 49, wherein the enhanced property is increased tensile strength.

54. The method according to claim 49, wherein the enhanced property is increased elongation.

55. A method for improving the processing characteristics of a water-developable photosensitive resin, said method comprising combining an effective amount of a coordination complex with the resin, wherein the coordination complex has the formula $M^+(Q)$, wherein M is an alkali metal, and Q is an anionic ligand.

56. A formulation comprising a solvent-developable photosensitive resin and a metal-containing additive, wherein said resin comprises a photosensitive copolymer, a basic nitrogen-containing compound, an unsaturated monomer, and optionally a photopolymerization initiator, wherein the photosensitive copolymer comprises an aliphatic conjugated diene monomer, an α,β-unsaturated carboxylic acid, a polyfunctional vinyl monomer, and a monofunctional vinyl monomer, and wherein said metal-containing additive is a coordination complex of the formula $M^{+n}(Q)_m$, wherein M is a metal, n and m are integers from 1 to 4, and Q is a carboxylate ligand.

57. The formulation according to claim 56, wherein the carboxylate is an acrylate.

58. The formulation according to claim 57, wherein the coordination complex is $Zn(acrylate)_2$.

59. The formulation according to claim 56, wherein the carboxylate is an acetate.

60. The formulation according to claim 59, wherein the coordination complex is $Zn(acetate)_2$, $Fe(acetate)_2$, or $Cu(acetate)_2$.

61. The formulation according to claim 56, wherein the metal is a transition metal.

62. The formulation according to claim 61, wherein the metal is Mn, Re, Fe, Ru, Os, Co, Rh, Ir, Ni, Pd, or Pt.

63. The formulation according to claim 62, wherein the metal is Fe, Ru, or Os.

64. The formulation according to claim 63, wherein the metal is Fe.

65. The formulation according to claim 56, wherein the metal is a main group metal.

66. The formulation according to claim 65, wherein the metal is Cu, Ag, Au, or Zn.

67. The formulation according to claim 66, wherein the metal is Zn or Cu.

68. The formulation according to claim 65, wherein the metal is an alkali metal.

69. The formulation according to claim 65, wherein the metal is an alkaline earth metal.

\* \* \* \* \*